(12) United States Patent
Tsujimoto et al.

(10) Patent No.: US 6,712,901 B2
(45) Date of Patent: Mar. 30, 2004

(54) SURFACE MODIFICATION PROCESS OF QUARTZ GLASS CRUCIBLE

(75) Inventors: Toshio Tsujimoto, Akita (JP); Yoshiyuki Tsuji, Akita (JP)

(73) Assignee: Japan Super Quartz Corporation, Tokyo (JP)

( * ) Notice: Subject to any disclaimer, the term of this patent is extended or adjusted under 35 U.S.C. 154(b) by 81 days.

(21) Appl. No.: 10/162,637

(22) Filed: Jun. 6, 2002

(65) Prior Publication Data

US 2003/0094131 A1 May 22, 2003

(30) Foreign Application Priority Data

Oct. 16, 2001 (JP) ........................................ 2001-318032

(51) Int. Cl.$^7$ .............................................. C30B 15/20
(52) U.S. Cl. .............................. 117/13; 117/19; 117/20; 117/13; 65/33.1; 65/30.1
(58) Field of Search .............................. 117/13, 19, 20; 65/33.1, 30.1

(56) References Cited

U.S. PATENT DOCUMENTS

| 4,422,965 | A | * | 12/1983 | Chickering et al. | ............ | 588/12 |
|---|---|---|---|---|---|---|
| 4,799,532 | A | * | 1/1989 | Mizuhara | ...................... | 164/47 |
| 5,009,688 | A | * | 4/1991 | Nakanishi | .................... | 65/17.2 |
| 5,976,247 | A | * | 11/1999 | Hansen et al. | .............. | 117/200 |
| 6,106,610 | A | * | 8/2000 | Watanabe et al. | ............. | 117/13 |
| 6,126,743 | A | * | 10/2000 | Saegusa et al. | ................ | 117/68 |

FOREIGN PATENT DOCUMENTS

EP        911429 A1  *  4/1999  ........... C30B/15/10

OTHER PUBLICATIONS

English Translation of JP 8–2932A (1996).*

* cited by examiner

Primary Examiner—Nadine Norton
Assistant Examiner—Matt Song
(74) Attorney, Agent, or Firm—Oblon, Spivak, McClelland, Maier & Neustadt, P.C.

(57) ABSTRACT

A process for modifying the surface of a quartz glass crucible and a modified quartz glass crucible produced by the process, where the crucible has a transparent coated layer containing a crystallization accelerator on the surface. The process includes coating a mixed solution containing a metal salt and a partial hydrolyzate of alkoxysilane oligomer on the surface of the crucible and heating to obtain a quartz glass crucible having a transparent coated layer. The crystallization promoter contains a metal oxide or a metal carbonate dispersed in a silica matrix.

13 Claims, No Drawings

SURFACE MODIFICATION PROCESS OF QUARTZ GLASS CRUCIBLE

BACKGROUND OF THE INVENTION

FIELD OF THE INVENTION

The present invention relates to a surface modification process of a quartz glass crucible and to a surface modified quartz glass crucible which is used in the process of pulling up silicon single crystal used for a semiconductor etc. from molten silicon.

DISCUSSION OF THE BACKGROUND

As one of the causes that a dislocation is formed in silicon single crystal in the pulling method, it has been known that cristobalite formed on the inside surface of the quartz glass crucible is released into the molten silicon. As a countermeasure to this, a process is known in which an alkaline earth metal is coated on an inside surface of the crucible to act as a crystallization promoter. The metal forms a cristobalite layer on the inside surface of the crucible at an early stage of pulling up (e.g. U.S. Pat. No. 5,976,247, Japanese Patent No. 3,100,836). In these inventions, a barium hydroxide solution is coated on the surface of the quartz glass crucible and the coated barium hydroxide reacts with carbon dioxide in air to form barium carbonate on the surface of the crucible. The barium carbonate is weakly adhered on the surface of the crucible by drying and is used as a crystallization promoter.

However, quartz glass crucibles surface-treated by conventional methods have the following problems and improvements are desired. That is, (A) since the barium carbonate powder on the quartz glass crucible is not fixed with any binder, the adhesion strength of the powder is very weak so that the powder is easily abraded and falls off when contacted by persons and instruments. Such abrasion occurs in the production process of the crucibles, such as product inspection, conveyance, and insertion to a carrying case, etc. It also occurs in the user's process, where the quartz glass crucible is set on a carbon susceptor in the crystal puller. As a result, its adhesion state becomes non-uniform and spotlike. Furthermore, there is also a possibility that worker health is negatively affected because barium carbonate powder is scattered when the carrying case is opened. (B) Since the adhesion strength of powder is very weak, nucleation efficiency as a crystallization promoter is low, and so the amount of barium carbonate required becomes excessive. (C) If the crucible is washed, the barium carbonate powder adhered on the surface of the crucible is washed away. It is then impossible to wash the crucible after the adhesion of the barium carbonate powder, even if some contaminants adhere on the surface of the crucible.

SUMMARY OF THE INVENTION

The present invention solves the problems of the conventional quartz glass crucible and provides a surface modified quartz glass crucible having a transparent coated layer which is not abraded upon contact with handling instruments or persons, has sufficient durability, and also provides its surface modification process.

That is, the present invention relates to the following surface modification process of the quartz glass crucible.

[1] A surface modification process of a quartz glass crucible, the process comprising, coating a mixed solution, (hereinafter referred to as the silica sol liquid), containing a metal salt and a partial hydrolyzate of alkoxysilane oligomer on the surface of the crucible, baking said coated solution to form a transparent coated layer containing a crystallization promoter derived from the metal salt in the silica matrix.

The surface modification process of the present invention includes the following processes.

[2] The surface modification process of a quartz glass crucible, wherein the metal salt is a metal organic acid salt or a metal carbonate of one or more kinds of magnesium, calcium, strontium, or barium.

[3] The surface modification process of a quartz glass crucible, the process comprising, coating the silica sol liquid on the whole or a part of the inside and/or outside of the surface of the quartz glass crucible, and baking said coated silica sol liquid.

[4] The surface modification process of the quartz glass crucible, wherein the silica sol liquid has 0.01 to 15 weight % of metal content, which is calculated as an oxide, and 0.5 to 30 weight % of silicon concentration, which is calculated as $SiO_2$, is used.

[5] The surface modification process of the quartz glass crucible, the process also comprising, drying the silica sol liquid, and baking said dried liquid at 350 to 1200° C. for 10 to 120 minutes.

In addition, the present invention also relates to the following quartz glass crucible.

[6] A quartz glass crucible, having a transparent coated layer, in which the crystallization promoter is dispersed in the silica matrix, on the whole or a part of the inside and/or outside surface of the crucible.

The quartz glass crucible of the present invention includes the following crucibles.

[7] The quartz glass crucible, wherein the crucible is made by, coating the silica sol liquid containing the metal salt and the partial hydrolyzate of alkoxysilane oligomer on the surface of the crucible, and baking the coated silica sol liquid to form a transparent coated layer containing the crystallization promoter derived from the metal salt in the silica matrix.

[8] The quartz glass crucible, wherein the crucible is made by coating the silica sol liquid containing a metal organic acid salt or a metal carbonate of one or more kinds of magnesium, calcium, strontium, or barium, on the surface of the crucible, and baking coated silica sol liquid to form the transparent coated layer containing the metal oxide or the metal carbonate as the crystallization promoter.

[9] The quartz glass crucible used as the crucible for silicon single crystal production.

The surface modified quartz glass crucible of the present invention has a hard and transparent coated layer, in which the metal oxide or the metal carbonate is dispersed in a silica matrix, on the whole or a part of the inside and/or outside surface of the crucible. In addition, the metal oxide or metal carbonate acts as a crystallization promoter to the surface glass layer of the crucible at the high temperature of pulling up the silicon single crystal. Therefore, when the crucible is used for the production of silicon single crystal, a uniform cristobalite layer is formed on the inside surface of the crucible at an early stage of pulling up, and as a result a high dislocation free ratio of the pulled crystal can be obtained. Moreover, the strength of the crucible under a high temperature is increased by the uniform cristobalite layer formed on the inside or outside surface of the crucible.

Moreover, since the coated layer is baked on the surface of the crucible, it is very stable and has high durability.

Therefore, there is no abrasion when contacted with instruments or persons and no problem that the adhesion state of the metal oxide in the coated layer becomes to non-uniform. In addition, even if the coating layer is comparatively thin, the surface of the crucible is crystallized uniformly during pulling up the single crystal and the dislocation free ratio of silicon can be increased. On the other hand, regarding the conventional quartz glass crucible having the adhered barium carbonate powder on its surface, since the adhesion strength of the barium carbonate powder is very weak, it can be washed away easily by acid washing. Therefore, it is impossible to wash the crucible even if some contaminants are adhered on the surface of the crucible. While regarding the surface modified quartz glass crucible of the present invention, since the coated layer is baked on the surface of the crucible, it is not washed away by acid washing. Contaminants on the surface of the crucible can be removed easily by acid washing.

DETAILED DESCRIPTION OF THE PREFERRED EMBODIMENTS

Hereafter, the present invention is explained concretely according to the preferred embodiment.

The surface modification process for producing the quartz glass crucible of the present invention is a formation process for a transparent coated layer on a surface of a crucible, where a crystallization promoter is dispersed in a silica matrix. Moreover, the quartz glass crucible of the present invention has a transparent coated layer on the whole or a part of the inside and/or outside surface of the crucible. The crystallization promoter is a metal compound except for silica, which is for example a metal oxide or metal carbonate. Concretely, the metal is for example, magnesium, calcium, strontium, or barium etc.

The transparent coated layer, where the crystallization promoter is dispersed in the silica matrix, can be formed by coating the mixed solution (the silica sol liquid) containing the metal salt and the partial hydrolyzate of alkoxysilane oligomer on the surface of the crucible, and by baking this coated silica sol liquid.

The silica sol liquid forming the transparent coated layer is a mixed solution which contains both a metal salt and a partial hydrolyzate of an alkoxysilane oligomer as components. The metal salt is for example a salt of magnesium, calcium, strontium, or barium, which is a useful metal as a crystallization promoter to promote the formation of the cristobalite layer on the surface of the quartz glass crucible. In addition, a silica sol liquid containing a stabilizing reagent can also be used. The preferred metal salt is a metal organic acid salt or a metal carbonate.

The most preferable metal organic acid salts are carboxylates. As an acyloxy group to form the carboxylate, the materials indicated by the general formula $C_nH_{2n+1}COO$, where n is an integer of 3 to 7, are preferable. Concretely, the acyloxy group derived from n-butyric acid, α-methyl butyric acid, iso-valeric acid, 2-ethyl butyric acid, 2,2-dimethyl butyric acid, 3,3-dimethyl butyric acid, 2,3-dimethyl butyric acid, 3-methyl pentanoic-acid, 4-methyl pentanoic acid, 2-ethyl pentanoic acid, 3-ethyl pentanoic acid, 2,2-dimethyl pentanoic acid, 3,3-dimethyl pentanoic acid, 2,3-dimethyl pentanoic acid, 2-ethyl hexanoic acid, or 3-ethyl hexanoic acid, etc., can be used suitably.

Moreover, when a β-diketone, such as 2,4-pentanedione (=acetylacetone), 3-methyl-2,4-pentanedione, 3-isopropyl-2,4-pentanedione, or 2,2-dimethyl-3,5-hexanedione etc., is mixed with said carboxylate solution, the preservation stability of the liquid is improved.

It is preferable that these organic acid salts are dissolved in an organic solvent. As the suitable organic solvent, an ester and/or an alcohol, or a mixed solvent, where the carboxylic acid is further mixed with an ester and/or an alcohol, can be used. As the ester of the organic solvent, ethyl acetate, propyl acetate, n-butyl acetate, sec-butyl acetate, tert-butyl acetate, iso-butyl acetate, n-amyl acetate, sec-amyl acetate, tert-amyl acetate, and iso-amyl acetate, are preferable.

As an alcohol, methanol, ethanol, 1-propanol, 2-propanol, 1-butanol, 2-butanol, iso-butyl alcohol, 1-pentanol, 2-pentanol, 2-methyl-2-pentanol, and iso-amyl alcohol, etc., are suitable. In alcohols, an alkoxy alcohol, i.e., the alcohol containing an ether group, is included. For example, 2-methoxyethanol and 1-methoxy-2-propanol can be used.

As another example of a usable solvent, a ketone, such as acetone, methylethylketone, and methyisobutylketone, and a hydrocarbon, such as toluene, xylene, hexane, and cyclohexane, can be used. It is possible that a mixture of two and more kinds of these organic solvents is used. The solution containing a carboxylate of a metal is mixed with the solution containing the partial hydrolyzate of an alkoxysilane oligomer, to provide the predetermined composition, and the silica sol liquid is prepared. The silica sol liquid has high wettability to the surface of the crucible. The final hard and transparent silica coated layer, in which the metal oxide is dispersed in the silica matrix, can be formed by baking to dehydrate said silica sol liquid after the organic components are removed completely.

The partial hydrolyzate of an alkoxysilane oligomer used in the present invention is obtained by a process in which the alkoxysilane oligomer is hydrolyzed under the controlled reaction conditions, and after the alcohol is removed, each generated OH group is bonded together to form the silica sol. As a suitable starting material, one or more silane compounds having at least one, preferably more than two, and more preferably more than three alkoxyl groups, can be used. Concretely, tetraethoxysilane (=ethylsilicate), tetrapropoxysilane, methyltriethoxysilane, dimethylmethoxysilane, phenyltriethoxysilane, chlorotrimethylsilane, various kinds of silane coupling reagents, such as vinyltriethoxysilane, γ-aminopropyltriethoxysilane, etc., also can be mentioned. Ethylsilicate, which is the cheapest and to be easily hydrolyzed, is preferred.

These alkoxysilanes are used as the hydrolyzate, which is partially hydrolyzed beforehand. The partial hydrolysis is carried out in the presence of an acid catalyst, i.e., an inorganic acid, such as hydrochloric acid, or an organic acid, such as p-toluene sulfonic acid, and water. Then, the reaction conditions, including, whether using the acid catalyst or not, the amount of acid catalyst, the amount of the water for hydrolysis in the reaction system, the reaction temperature and the reaction time, are adjusted to obtain the partial hydrolyzate of alkoxysilane oligomer, where the degree of polymerization is controlled. It is preferable that the partial hydrolysis is carried out with heating and stirring in an organic solvent containing water. In addition, it is preferable that the reaction temperature is 30 to 60° C., more preferably 35 to 55° C., and the reaction time is 2 to 5 hours.

Regarding the metal amount in said silica sol liquid, it is preferable that the metal amount in the coated layer is $1 \times 10^{-9}$ to $1 \times 10^{-6}$ mol/cm$^2$, which is calculated as an oxide, when the coated silica sol liquid is baked to form said coated layer on the surface of the crucible. For example, it is preferable that the metal content of the silica sol liquid is 0.01 to 15 weight %, preferably 0.5 to 10 weight %, which is calculated as an oxide, and the silicon concentration is 0.5 to 30 weight %, which is calculated as $SiO_2$. The solution containing the metal salt and the partial hydrolyzate solution of alkoxysilane oligomer, are mixed and prepared to provide the preferable metal content and silicon concentration. When the metal content is less than 0.01 weight %, which is calculated as an oxide, a repeat coating is necessary to form the desired devitrification layer thickness on the surface of the crucible. On the other hand, when the content is more than 15 weight %, it is difficult to make a stable mixed solution. Moreover, when the silicon concentration is less than 0.5 weight %, which is calculated as $SiO_2$, the strength of the formed coated layer is not sufficient, and when the concentration is more than 30 weight %, it is difficult to make the mixed solution stable. It is preferable that the silicon concentration is 0.5 to 30 weight %, more preferably 1 to 20 weight %.

As the method for coating the silica sol liquid on the surface of the crucible a spray method and a dipping method, etc. can be used, and the coating method is not limited. In addition, the silica sol liquid on the surface of the crucible can be coated on a part or the whole of the inside surface or can be on a part or the whole of the outside surface; or can be on a part or the whole of both inside and outside surfaces. In order to increase the dislocation free ratio of the single crystal crystallizing the inside surface of the crucible during pulling up of the crystal, the silica sol liquid must be coated on at least the whole or a part of the inside surface of the crucible.

The silica sol liquid is coated on the surface of the crucible and is baked. It is suitable that the baking temperature is 350 to 1200° C., preferably 600 to 1000° C., and the baking time is 10 to 120 minutes. When the baking temperature is less than 350° C., the strength of the coated layer is not sufficient, and when said temperature is more than 1200° C., there is a possibility that the coated layer is devitrified. By this baking, the silica component of the silica sol liquid forms the hard silica matrix. Moreover, regarding the silica sol liquid containing the metal organic acid salt as the metal salt, the metal organic acid salt is decomposed into the metal oxide and the transparent coated layer in which the metal oxide is uniformly dispersed in the silica matrix, is formed on the surface of the crucible.

On the other hand, regarding the quartz glass crucible containing the metal carbonate, when the baking temperature is more than the decomposition temperature of the metal carbonate, the coated layer, where the metal carbonate is decomposed to the metal oxide to disperse in the silica matrix, is formed. On the other hand when the baking temperature is less than the decomposition temperature, the coated layer, where the metal carbonate is dispersed in the silica matrix a metal carbonate, is formed. In addition, when the baking temperature is near the decomposition temperature of the metal carbonate, the coated layer, where the metal oxide decomposed from a part of the metal carbonate and the non-decomposed metal carbonate are mixed, can be formed.

EXAMPLE 1

Preparation of a Partial Hydrolyzate of Alkoxysilane Oligomer

Two kinds of a partial hydrolyzate of alkoxysilane oligomer of (I) and (II) were prepared at the mixing ratios of raw materials and the reaction conditions, shown in Table 1.

EXAMPLE 2

Preparation of the Silica Sol Liquid (2-1) 13.8 g of 2-ethylhexanoic barium $(C_7H_{15}COO)_2Ba$ was dissolved in a mixed solvent of 60 g of iso-amyl alcohol and 26.2 g of iso-amyl acetate to make a 5 weight % solution, which was calculated as BaO. Next, 20 g and 50 g of the partial hydrolyzates of alkoxysilane oligomer shown in Table 1 (I), were added and mixed with 20 g, 40 g, and 50 g of the solutions respectively. Furthermore, in the liquid A and the liquid B, 1-butanol was added to adjust the concentrations. Then, the silica sol liquids of A, B, and C shown in Table 2 were prepared.

(2-2) 24.0 g of 2-ethylbutyric barium $(C_5H_{11}COO)_2Ba$ was dissolved in a mixed solvent of 70 g of 1-butanol and 6 g of acetylacetone, and refluxed to make 10 weight % solution, which was calculated as BaO. Next, 40 g and 80 g of the partial hydrolyzates of alkoxysilane oligomer shown in Table 1 (II) were added to mix with 20 g and 50 g of the solutions respectively. Furthermore, in the liquid D, iso-amyl alcohol was added to adjust the concentration. Then, the silica sol liquids D and E shown in Table 2 were prepared.

(2-3) 0.5 g of barium carbonate powder having an average particle size of 10 μm was dispersed in 100 g of a partial hydrolyzate of alkoxysilane oligomer shown in Table 1 (I) to prepare the silica sol liquid F in Table 2. In the reaction vessel for the preparation, the equipment having the stirring propeller was used to prevent the precipitation of the barium carbonate powder.

EXAMPLE 3

Formation of the Coated Layer

Five kinds of the silica sol liquids, (A–E), shown in Table 2, were sprayed to coat the surfaces of quartz glass crucibles single crystal silicon production, and the single crystal, and the coated layers were formed by baking the coated liquids at 850° C. for 30 minutes, wherein the crucibles were made by an arc fusion with rotating mold method, which is generally used in the process to produce the crucible for pulling up a single crystal.

In this case, the quartz glass crucibles were surface treated by using the liquids F and H. Sample No. 6 was made by spaying the silica sol liquid F to coat the surface of the crucible to be burned at 850° C. for 30 minutes. In addition, Sample No. 8 was made by a conventional coating method. This is, the liquid H, where barium hydroxide octahydrate was mixed with water, in which, the mixing ratio is 3 g of barium hydroxide octahydrate in 1-liter of water, was sprayed on the crucible to heat at 300° C. with carbon dioxide gas.

EXAMPLE 4

Strength of the Coated Layer

The mechanical strength of the coated layer formed by using the liquids A, F, and H, shown in Table 2, was evaluated according to the specification standard (JIS 5600-5-4). This evaluation was done using a scratching method with a marketed pencil (trade name Mitsubishi UNI). The results are shown in Table 3. Regarding the coated layer formed by using the liquid A of the present invention, the strength of the layer was high since the layer was glassy, and scratching did not appear with the pencil. Moreover, regarding the coated layer formed by using the liquid F, although the barium carbonate powder was contained, the silica component became a binder, so that the strength of the layer was high, and scratching did not appear with a pencil. On the other hand, regarding the coated layer formed by using the conventional liquid H, scratching appeared using a pencil of 3H hardness. From these results, it was confirmed that the coated layer of the present invention had remarkably stronger mechanical property than the conventional layer.

EXAMPLE 5

Washing Test

Washing tests were carried out on the quartz glass crucibles, (No. 1, 6, 8) in Table 2, which, were coating treated. The tests were conducted on the following processes. (1) Washing with pure water and drying. (2) Washing with pure water and drying after washing with dilute hydrochloric acid. The adhesion amounts of the residual barium on the surface after each washing test, are shown in Table 3. Regarding the quartz glass crucible of the present invention (No. 1), barium was not removed, and the adhesion amounts were not changed in the water washing process (1) and the acid washing process (2). Moreover, regarding the quartz glass crucible of the present invention (No. 6), although the form of barium was the barium carbonate, which was same as the conventional, one, since the barium carbonate was dispersed in the silica sol liquid and coated and baked, the coated silica became the preservation layer. So the barium was not removed in the washing process (1) and the acid washing process (2) like the quartz glass crucible (No. 1). On the other hand, regarding the conventional quartz glass crucible (No. 8), since the barium carbonate was not baked, the barium was washed away a little in the water washing process (1), and the barium carbonate was washed away completely in the acid washing process (2).

EXAMPLE 6

Test of the Dislocation Free Ratio

The pulling up tests of the silicon single crystal were carried out by using quartz glass crucibles having transparent coated layers (No. 1 to No. 5), and the quartz glass crucible where the barium carbonate powder was dispersed in the partial hydrolyzate of the alkoxysilane oligomer (No. 6). The dislocation free ratios of the pulled crystals, are shown in Table 4. (The dislocation free ratio is defined as kilograms of dislocation free single crystal per kilograms of polysilicon charged to the crucible.) Moreover, for the comparison, the same pulling up tests were also conducted on quartz glass crucible (No. 7), in which the surface was not modified and there is no crystallization promoter layer on its surface and to the quartz glass crucible (No. 8), in which the crystallization promoter layer was formed by a conventional method. The dislocation free ratios of the single crystal are shown in Table 4. In addition, the thickness of the crystallization layer of the crucible after pulling up the single crystal was measured. The thickness of the crystallization layers is shown in Table 4. As shown in the results in Table 4, regarding the quartz glass crucible of the present invention, the crystallization layers having the sufficient layer thickness were formed on the surface of the crucible also with comparatively a little amount of barium, and a high dislocation free ratio could be obtained. On the other hand, regarding the quartz glass crucible of the comparative example No. 7, the dislocation free ratio was remarkably low. Moreover, regarding the quartz glass crucible of the comparative example No. 8, where barium carbonate was adhered by the conventional method, although this quartz glass crucible has the almost same adhesion amount of barium as used of the present invention, the crystallization layer after pulling up the single crystal was thin in the crucible, and the dislocation free ratio was remarkably low.

EXAMPLE 7

Burning Temperature

The silica sol liquid (No. 1) shown in Table 2 was sprayed to coat the surface of a quartz glass crucible for pulling up the single crystal, and a coated layer was formed by baking said coated liquid at the temperatures shown in Table 5 for 30 minutes. The mechanical strength of the coated layer was evaluated according to the specification standard (JIS 5600-5-4). This evaluation was carried out using the scratching method with a marketed pencil (trade name Mitsubishi UNI). Furthermore, washing tests were also conducted. The washing tests were carried out by measuring the adhesion amount of the residual barium on the surface after washing with pure water and drying. Moreover, for comparison, the same tests were conducted on a quartz glass crucible which was not baked after coating. These results are shown in Table 5.

As shown by these results, regarding the coated layer baked at a temperature of more than 600° C., scratching did not appear when using a pencil of hardness 6H, and the adhesion amount of barium in the coated layer after washing was not changed. In addition, regarding the coated layer baked at 400° C., although the thin trace of the scratching was sometimes appeared with a pencil of hardness 6H, cracking did not appear with a pencil of hardness 5H, and the decreased adhesion amount of barium by washing was remarkably low. On the other hand, regarding the coated layer baked at 200° C., since the baking was not sufficient, scratching appeared with a pencil of hardness 3H, and the adhesion amount of barium decreased to less than half by washing. In addition, regarding the coated layer, which was not baked, since the layer was soft due to being in the gel state, scratching appeared using a pencil of hardness 2B easily, and the coated layer was almost washed away in the washing test due not being baked.

EXAMPLE 8

Multi-pulling Test

Regarding the quartz glass crucible having the coated layer of the present invention (No. 3), the crystal layer was formed uniformly on the inside surface of the crucible with the crystallization promoter contained in the coated layer, and the releasing of cristobalite did not occur. Therefore, even when the pulling up of a single crystal was repeated 4 times, a high dislocation free ratio, which was the level of 80%, was kept. As a result, the crucible life was prolonged. On the other hand, regarding the conventional quartz glass crucible having weakly adhered barium carbonate powder, (No. 8) in Table 2, the cristobalite was deposited non-uniformly and partially as the pulling up was repeated. Then, the frequency of the release of cristobalite to the molten silicon increases so that the dislocation free ratio was decreased gradually. In addition, regarding the crucible, in which the pulling up the single crystal was repeated 4 times, the cristobalite layer was not identified on the surface of the crucible. By the way, regarding the conventional quartz glass crucible having the adhered barium carbonate powder (No. 8), it is necessary that the amount of adhered barium is more than 20 $\mu g/cm^2$ for obtaining the multi-pulling effect, which was the same as the present invention. When such an amount of barium is adhered on the surface of the crucible, it cannot be avoided to give the bad influence to the quality of the single crystal silicon.

Regarding the quartz glass crucible having the coated layer of the present invention (No. 3), the crystal layer was formed uniformly on the inside surface of the crucible with the crystallization accelerator contained in the coated layer, and the releasing of cristobalite was stopped. Therefore, even when the pulling up of a single crystal was repeated 4 times, a high dislocation free ratio, which was the level of 80%, was kept. As a result, the crucible life was prolonged. On the other hand, regarding the conventional quartz glass crucible having weakly adhered barium carbonate powder, (No. 8) in Table 2, the cristobalite was deposited non-uniformly and partially as the pulling up was repeated. Then, the frequency of the release of cristobalite to the molten silicon increases so that the dislocation free ratio was decreased gradually. In addition, regarding the crucible, in which the pulling up the single crystal was repeated 4 times, the cristobalite layer was not identified on the surface of the crucible. By the way, regarding the conventional quartz glass crucible having the adhered barium carbonate powder (No. 8), it is necessary that the amount of adhered barium is more than 20 $\mu$m/g for obtaining the multi-pulling effect, which was the same as the present invention. When such an amount of barium is adhered on the surface of the crucible, it cannot be avoided to give the bad influence to the quality of the single crystal silicon.

EXAMPLE 9

Other Crystallization Accelerator 2-ethylhexanoic acid salts of Mg, Ca, and Sr were added to the partial hydrolyzate of the alkoxysilane oligomer shown in Table 2 (I) to prepare a silica sol liquid. The silica sol liquid was sprayed to coat a quartz piece having 10 cm square, and the transparent coated layer was formed by baking said coated liquid at 850° C. for 30 minutes. The adhesion amount of the metal was adjusted, so that it became 1 $\mu$g/cm$^2$, which was calculated as an oxide. Next, the transparent coated layer was put into an electric furnace to bake at 1450° C. for 5 hours in argon gas at 1 atmosphere pressure. Then, it was confirmed that the uniform crystallization layer could be formed by also using all said metals.

Effect of the Invention

A quartz glass crucible has a transparent coated layer containing a crystallization promoter on the surface, and since the coated layer forms an integrated structure to the surface of the crucible, there is no abrasion, and the adhesion state of a crystallization promoter, such as barium, contained in the coated layer, is kept uniformly. Therefore, the cristobalite formation on the surface of the crucible during pulling up the single crystal is completely uniform, so that an excellent dislocation free ratio can be obtained. Moreover, there is no problem that the coated layer is abraded in contact with the handling instruments or persons, in the working process after making the crucible, during from the inspection to the shipment, and the working process in the user side of the crucible. In addition, there is no conventional problem that the fine barium carbonate powder is scattered whenever the case containing the crucible is opened.

TABLE 1

|  | Oligomer (I) | Oligomer (II) |
| --- | --- | --- |
| Starting Raw Material and Used Amount | Ethylsilicate40 150 g | Ethylsilicate40 67.5 g |
| Solvent and Used Amount | Ethylalcohol 400 g | Ethylalcohol 1.1 g |
| Catalyst and Used Amount | 60% concentration of Nitric acid 0.6 g | 60% concentration of Nitric acid 0.7 g |
| Additional Amount of Water | 45 g | 36.4 g |
| Reaction Temperature and Time | 45° C.-3 hours | 45° C.-3 hours |
| Silica Solid Part | About 10 wt. % | About 25 wt. % |

TABLE 2

| | | | Silica Sol Liquid | | | | Adhesion |
| --- | --- | --- | --- | --- | --- | --- | --- |
| No. | Kinds | Oligomer | Solutions Containing Metal Salt | Dilution Alcohol | BaO Amounts | SiO$_2$ Amounts | Amounts of Metal Oxide |
| 1 | A | (I) | 20 g  5 wt. % Calculated as BaO 20 g | Butanol 60 g | 1 | 2 | 0.6 |
| 2 | B | (I) | 20 g  5 wt. % Calculated as BaO 40 g | Butanol 40 g | 2 | 2 | 0.8 |
| 3 | C | (I) | 5 g  10 wt. % Calculated as BaO 50 g | — | 5 | 5 | 1 |
| 4 | D | (II) | 40 g  10 wt. % Calculated as BaO 50 g | Isoamyl 10 g | 5 | 10 | 5.2 |
| 5 | E | (II) | 80 g  10 wt. % Calculated as BaO 20 g | — | 2 | 20 | 9.5 |
| 6 | F | (I) | 100 g  Carbonic Acid Ba Powder 0.5 g | — | 0.4 | 10 | 2.1 |
| 7 | G | Non-Surface Treatment | | | | | 0 |
| 8 | H | Conventional Ba Carbonate Powder | | | | | 1 |

(Note) (I) and (II) of Oligomer is same as Table 1. Amounts of BaO and SiO$_2$ are in wt. %. Isoamyl is Isoamyl Alcohol, Adhesion Amounts of Metal Oxide is in $\mu$g/cm$^2$

TABLE 3

| Sample No. | 1 | 6 | 8 |
| --- | --- | --- | --- |
| Silica Sol Liquids | A | F | H |
| Hardness of Coated Layer (Hardness by Pencil) | No Cracking by 6H | No Cracking by 6H | Cracking Appeared by 3H |
| Ba Amount Before Washing | 0.6 | 2.1 | 1.0 |
| (1) Ba Amounts After Water Washing and Drying | 0.6 | 2.1 | 0.3 |
| (2) Ba Amounts After Acid Washing, Water Washing, and Drying | 0.6 | 2.1 | 0 |

(Note) Ba amounts is $\mu$g/cm$^2$

TABLE 4

| No. | 1 | 2 | 3 | 4 | 5 | 6 | 7 | 8 |
|---|---|---|---|---|---|---|---|---|
| Dislocation free ratio % | 81 | 83 | 85 | 83 | 80 | 81 | 35 | 55 |
| Crystallization Layers After Pulling up μm | 80 | 77 | 83 | 95 | 90 | 103 | 0 | 10 |

TABLE 5

| Baking Temperature | Not-Baked | 200° C. | 400° C. | 600° C. | 800° C. | 1000° C. |
|---|---|---|---|---|---|---|
| Hardness of coating Layer | Cracking Appeared by 2B | Cracking Appeared by 3H | No Cracking by 5H | | No Cracking By 6H | |
| Washing Test | | | | | | |
| Ba Amounts Before Washing | 0.6 | 0.6 | 0.6 | | 0.6 | |
| Ba Amounts After Washing and Drying | 0 | 0.2 | 0.5 | | 0.6 | |

TABLE 6

| | Dislocation free ratio % | | | |
|---|---|---|---|---|
| Number of Times of Pulling up | 1 | 2 | 3 | 4 |
| Coated Crucible (No. 3) | 85 | 85 | 83 | 83 |
| Conventional Crucible Having Ba Carbonate Powder (No. 8) | 55 | 50 | 47 | 42 |

Japanese application 2001-318032, filed on Oct. 16, 2001 is incorporated herein by reference in its entirety.

Obviously, numerous modifications and variations of the present invention are possible in light of the above teachings. It is therefore to be understood that within the scope of the appended claims, the invention may be practiced otherwise than as specifically described herein.

What is claimed is:

1. A process for modifying a surface of a quartz glass crucible, said process comprising, coating a silica sol liquid comprising a metal salt and a partial hydrolyzate of an alkoxysilane oligomer on said surface of said crucible, and heating said crucible coated with said silica sol liquid to form a transparent coated layer comprising a crystallization promoter derived from said metal salt.

2. The process of claim 1, wherein the metal salt is a metal organic acid salt or a metal carbonate of one or more of magnesium, calcium, strontium, or barium.

3. The process of claim 1, wherein the silica sol liquid is coated on the whole or a part of an inside and/or outside surface of the quartz glass crucible.

4. The process of claim 1, wherein the silica sol liquid comprises 0.01 to 15 weight % of metal content, based on an oxide, and 0.5 to 30 weight % of silicon concentration, based on $SiO_2$.

5. The process of claim 1, further comprising, drying the coated silica sol liquid, and heating said dried silica sol liquid at a temperature of from 350 to 1200° C., for 10 to 120 minutes.

6. The process of claim 1, wherein the metal organic salt is a carboxylate of formula $C_nH_{2n+1}COO$, where n is an integer of from 3 to 7.

7. The process of claim 6, wherein the metal salt is selected from the group consisting of n-butyric acid, α-methyl butyric acid, iso-valeric acid, 2-ethyl butyric acid, 2,2-dimethyl butyric acid, 3,3-dimethyl butyric acid, 2,3-dimethyl butyric acid, 3-methyl pentanoic-acid, 4-methyl pentanoic acid, 2-ethyl pentanoic acid, 3-ethyl pentanoic acid, 2,2-dimethyl pentanoic acid, 3,3-dimethyl pentanoic acid, 2,3-dimethyl pentanoic acid, 2-ethyl hexanoic acid, and 3-ethyl hexanoic acid.

8. The process of claim 1, wherein the silica sol liquid further comprises a β-diketone.

9. The process of claim 1, wherein the silica sol liquid further comprises an organic solvent selected from the group consisting of an ester, an alcohol, a ketone and a hydrocarbon.

10. The process of claim 1, wherein the partial hydrolyzate of an alkoxysilane oligomer is obtained by hydrolyzing one or more silane compounds having at least one alkoxy group.

11. The process of claim 10, wherein the alkoxysilane oligomer is selected from the group consisting of tetraethoxysilane, tetrapropoxysilane, methyltriethoxysilane, dimethylmethoxysilane, phenyltriethoxysilane, chlorotrimethylsilane, vinyltriethoxysilane, and aminopropyltriethoxysilane.

12. The process of claim 1, wherein the silica sol liquid comprises from 0.5 to 10 wt. % of metal content based on an oxide.

13. The process of claim 1, wherein the crucible coated with the silica sol liquid is heated at a temperature of 350 to 1200° C., for 10–120 minutes.

* * * * *